United States Patent [19]

Klosowiak et al.

[11] Patent Number: 5,434,362
[45] Date of Patent: Jul. 18, 1995

[54] FLEXIBLE CIRCUIT BOARD ASSEMBLY AND METHOD

[75] Inventors: Tomasz L. Klosowiak, Glenview; David W. Currier, Algonquin; Gary K. Mui, Wheeling, all of Ill.

[73] Assignee: Motorola, Inc., Schaumburg, Ill.

[21] Appl. No.: 300,762

[22] Filed: Sep. 6, 1994

[51] Int. Cl.⁶ .......................................... H05K 1/02
[52] U.S. Cl. .................................. 174/254; 361/748; 439/77
[58] Field of Search ..................... 174/254; 361/748; 439/67, 77

[56] References Cited

U.S. PATENT DOCUMENTS

| | | | |
|---|---|---|---|
| 4,811,165 | 3/1989 | Currier et al. | 29/848 |
| 4,958,260 | 9/1990 | Kobayashi et al. | 361/398 |
| 5,101,322 | 3/1992 | Ghaem et al. | 361/386 |
| 5,103,375 | 4/1992 | Cottingham et al. | 361/386 |
| 5,159,751 | 11/1992 | Cottingham et al. | 29/832 |
| 5,170,326 | 12/1992 | Meny et al. | 361/395 |
| 5,179,501 | 1/1993 | Ocken et al. | 361/388 |
| 5,216,581 | 6/1993 | Fisher et al. | 361/392 |
| 5,220,488 | 6/1993 | Denes | 361/398 |
| 5,229,916 | 7/1993 | Frankeny et al. | 361/386 |
| 5,265,322 | 11/1993 | Fisher et al. | 29/848 |

Primary Examiner—Leo P. Picard
Assistant Examiner—L. Thomas
Attorney, Agent, or Firm—Phillip H. Melamed

[57] ABSTRACT

A flexible circuit board assembly (10) includes a flexible substrate (11) having first and second end portions (14,15) and an intermediate portion (16). Conductive metalization interconnect paths (17) extend between the substrate end portions (14, 15) and across the intermediate portion (16). The substrate first and second end portions are mounted to first and second end portions (21, 22) of a rigidizer plate (20). Stiffening material (35) is provided on the flexible substrate intermediate portion (16) to define stiff (36, 37, 38) and less stiff (39, 40) paths that extend across the interconnect paths (17) and the substrate intermediate portion (16) and define desired bend curvature characteristics for the flexible substrate intermediate portion (16). A method utilizes this structure to provide a flexible circuit board assembly (10), preferably with a bent rigidizer plate (20).

27 Claims, 3 Drawing Sheets

FLEXIBLE CIRCUIT BOARD ASSEMBLY AND METHOD

FIELD OF THE INVENTION

The present invention relates to flexible circuit board assemblies and/or their method of manufacture. More particularly, the present invention is directed to providing such flexible circuit board assemblies in which a flexible substrate is mounted to a rigidizer plate wherein it is contemplated that preferably the rigidizer plate will be or has been bent.

BACKGROUND OF THE INVENTION

Prior electronic module assemblies are known in which a polyimide flexible circuit board substrate has been mounted to a rigidizer plate and the rigidizer plate is then bent such that the plate forms part of an exterior housing for an electronic module assembly which includes the flexible substrate. Examples of such prior art structures are shown in U.S. Pat. Nos. 5,103,375, 5,159,751, 5,216,581, 5,265,322 and 5,170,326 all assigned to the same assignee as the present invention. Such assemblies generally contemplate the use of an integral mandrel or a removable mandrel to implement bending the rigidizer plate of the flexible circuit board assembly around one or more bend axes. In such assemblies, generally an intermediate portion of the flexible substrate is left unbonded or unmounted to the underlying rigidizer plate to prevent excessive stressing of the flexible substrate during the bending process and/or rupturing of conductive interconnect paths on the flexible substrate during the bend process. However, it has been determined that by having such an unbonded intermediate portion of the flexible substrate, the flexible substrate may bend in an undesirable manner during the bending process creating creasing of the flexible substrate or areas of potential high stress. This may result in rupturing conductive interconnect paths of the flexible substrate immediately or during thermal cycling. What is therefore desired is an improved flexible circuit board assembly and method which avoids implementing undesired bends for the flexible substrate during the bending process.

BRIEF DESCRIPTION OF THE DRAWINGS

The present invention can be better understood by reference to the drawings in which.

DESCRIPTION OF THE PREFERRED EMBODIMENTS

Figure 1:
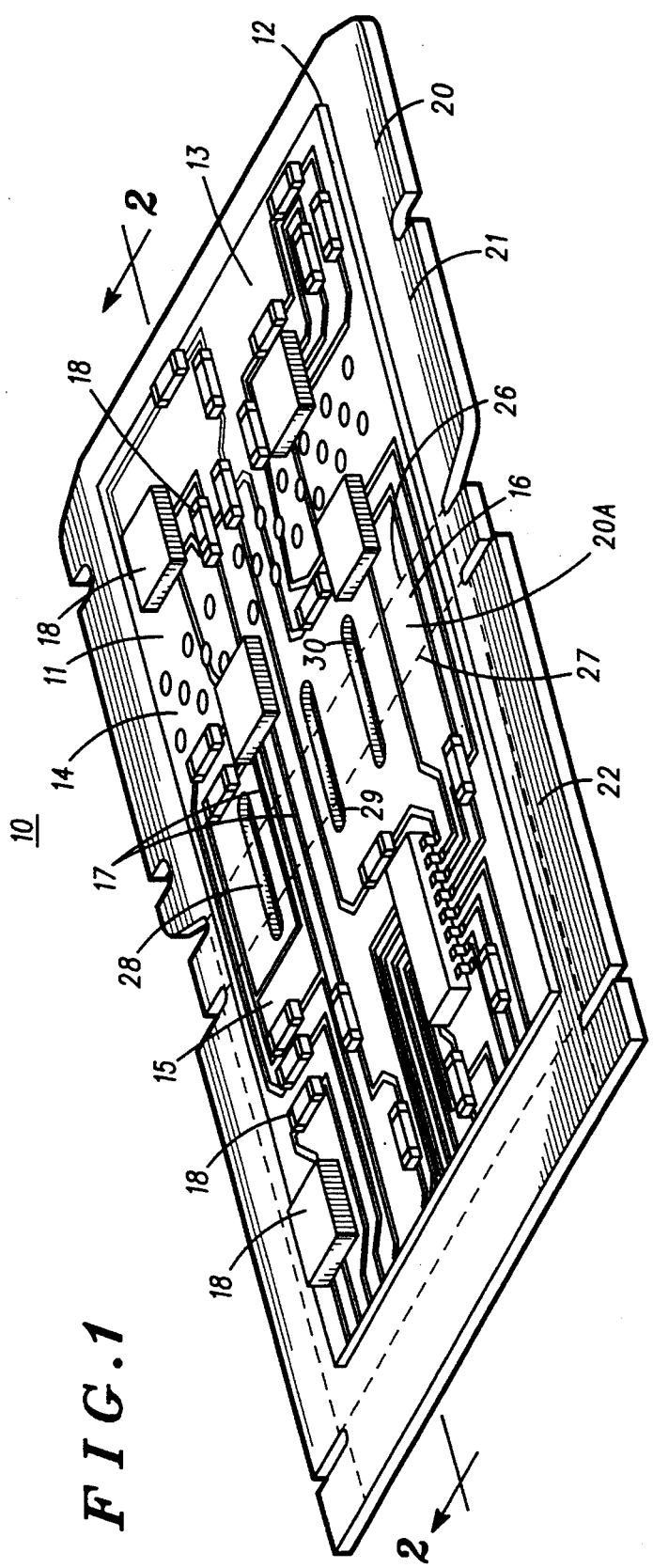
FIG. 1 is a perspective view of a flexible circuit board assembly prior to bending and constructed in accordance with the present invention wherein significant details of the assembly are shown in other figures.

Referring to FIG. 1, a flexible circuit board assembly 10 is illustrated prior to a contemplated bending operation. In FIG. 1 the assembly 10 is shown as being substantially planar in configuration and comprises a flexible substrate 11 of electrically insulating material, such as polyimide, having a predetermined thickness 12 and a top surface 13 extending between first and second end portions, 14 and 15 of the flexible substrate 11. An intermediate portion 16 of the flexible substrate 11 is located between the first and second end portions 14 and 15. A plurality of conductive metalization interconnect paths 17 are provided on and are fixed to the flexible substrate 11 and essentially comprise copper metalization paths formed on the top surface 13. These metalization interconnect paths 17 each extend from at least the substrate first end portion 14 across the substrate intermediate portion 16 to the substrate second end portion 15 and thereby interconnect electrically the substrate portions 14 and 15. In addition to these conductive metalization interconnect paths 17, there are other conductive metalization paths provided on the substrate 11 which do not extend across the intermediate portion 16. Also, a plurality of components 18 of various configurations are contemplated as being provided on each of the first and second end portions 14 and 15 of the substrate 11.

Because the flexible substrate 11 is made of a flexible material and has a thickness 12 that is generally in the range of 1 to 3 mil (0.001 to 0.003 inches) ((25.4 to 76.2) $10^{-6}$ meters), typically the flexible substrate is mounted to some sort of rigidizer or carrier. This is the case for the assembly 10. More specifically, a rigidizer plate 20, preferable of aluminum or another bendable metallic material, having a preferred thickness of 0.020 to 0.090 inches ((0.5 to 2.3) $10^{-3}$ meters), is provided. The rigidizer plate 20 has first and second end portions 21 and 22 and an intermediate portion 20A therebetween. The first and second flexible substrate end portions 14 and 15 are mounted to the first and second end portions of the rigidizer plate 20 with the substrate intermediate portion 16 comprising an unmounted portion of the flexible substrate between the first and second end portions 21 and 22 of the rigidizer plate 20 and adjacent the intermediate portion 20A. Typically the mounting of the flexible substrate 11 to the rigidizer plate 20 occurs by bonding the substrate portions 14 and 15 to the rigidizer portions 21 and 22 by use of a pressure sensitive adhesive or other type of adhesive layer shown as element 23 in FIG. 2. Also, it should be noted that while a single rigidizer plate 20 is illustrated in FIG. 2, the rigidizer plate could comprise separate plate portions forming the rigidizer plate end portions 21 and 22 wherein these separate end portions are mounted on an underlying single thin metal plate forming part of the rigidizer structure.

Figure 2:
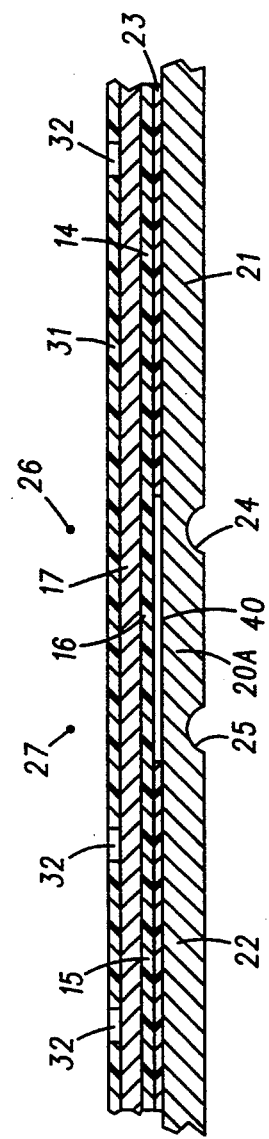
FIG. 2 is a cross sectional view of a portion of the assembly shown in FIG. 1 taken along line 2—2.

Referring to FIG. 2, a cross sectional view of an intermediate portion of the assembly 10 shown in FIG. 1 is illustrated. This view better illustrates that channels 24 and 25 are formed in the rigidizer plate and essentially define two substantial parallel preferential bend axes 26 and 27 for the assembly 10. These axes are also shown, in dashed form in FIG. 1, along with other bend axes, and extend across the intermediate portion 16 of the flexible substrate and across the interconnect conductive metalization paths 17. The preferential bend axes 26 and 27 are essentially formed by the channels 24 and 25 reducing the thickness of the rigidizer plate at certain locations and therefore making it easier to bend the rigidizer plate 20 at those locations. It is contemplated that the rigidizer plate 20 will be bent around the bend axes 26 and 27. To facilitate this bending, a number of through whole openings 28, 29 and 30 are provided in the flexible substrate 11 as shown in FIG. 1. The purpose of these through whole openings is to allow projections of a bending mandrel to pass through the substrate 11 and directly contact the rigidizer plate 20 to facilitate bending the rigidizer plate around the axes 26 and 27 without applying undue stress directly to the flexible substrate by the mandrel. This is explained in detail in prior U.S. Pat. Nos. 5,216,581 and 5,265,322, and such through holes are also illustrated in prior U.S. Pat. No. 5,170,326. These openings do not form a significant feature of the present invention. Alternatively, an unbonded loop for the intermediate portion 16 can be provided and the mandrel can be inserted between the flexible substrate 11 and rigidizer plate 20 to implement bending. However neither of these types of configurations for use of a mandrel form a significant feature of the present invention.

It should be noted that FIG. 2 also illustrates, besides one of the interconnect metalization paths 17, the flexible substrate 11, the bonding adhesive 23 and the rigidizer plate 20, an insulating solder mask layer 31. The solder mask layer 31 is applied on top of the flexible substrate 11 and metalization layers on the flexible substrate top surface 13. Openings 32 in the solder mask layer are provided at various locations such that solder contact can then be made directly to underlying metalization layers. Utilization of a solder mask layer for this stated purpose is conventional.

Figure 3:
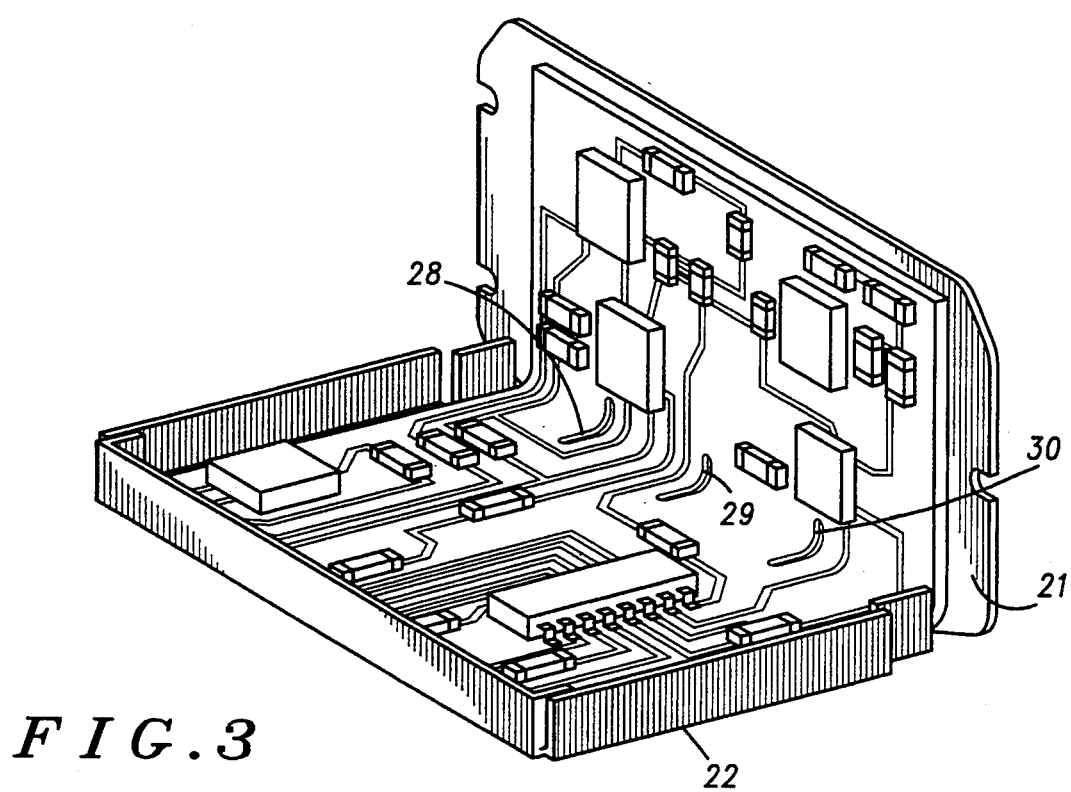
FIG. 3 is a perspective view of the assembly in FIG. 1 after partial bending.
Figure 4:
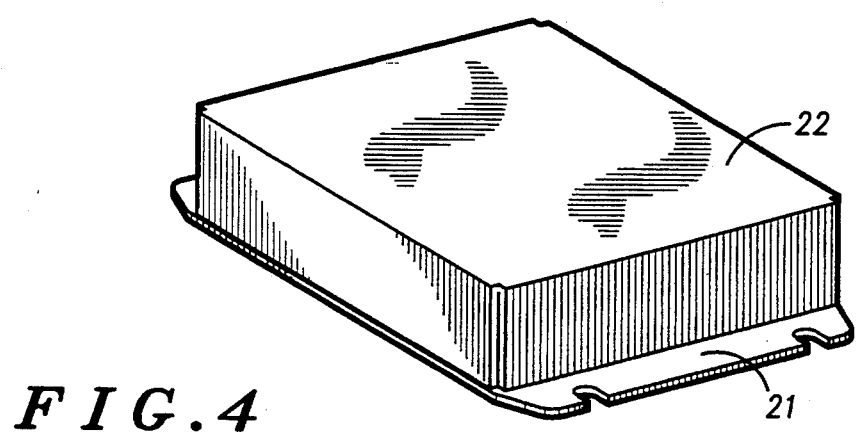
FIG. 4 is a perspective view of the assembly in FIG. 1 after bending has been completed.

Referring now to FIG. 3, a partial bending of the assembly 10 shown in FIG. 1 is illustrated wherein only a bend around one of the axes 26 and 27 is illustrated even though preferably the bends around both the axes 26 and 27 would be simultaneously implemented. The reason why this simultaneous bending has not been illustrated in FIG. 3 is just for the purpose of clarity. Also, FIG. 3 does not illustrate any mandrel that implements the bending operation, but it is understood that preferably such a mandrel is present and preferably has projections which protrude through the openings 28, 29 and 30 in the flexible substrate. FIG. 4, illustrates the completely bent assembly 10 wherein it is noted that now the rigidizer end portions 21 and 22 are non-coplanar but substantial parallel to one another, whereas in FIG. 3 these portions have been bent out of their originally planar configuration such that the portions are also non-coplanar. Of course the same holds true for the flexible substrate end portions 14 and 15 which are bonded to the rigidizer end portions 21 and 22.

Figure 5:
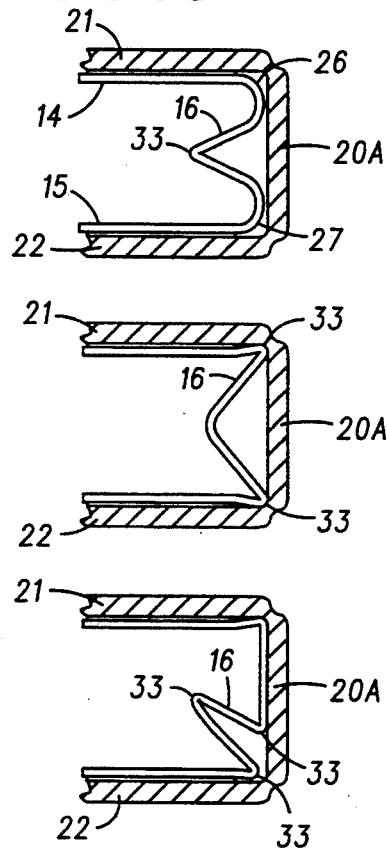
FIG. 5 illustrates, in diagrammatic form, three enlarged cross sectional views of a portion of the assembly shown in FIG. 1 if the present invention had not been utilized in such an assembly.
Figure 6:
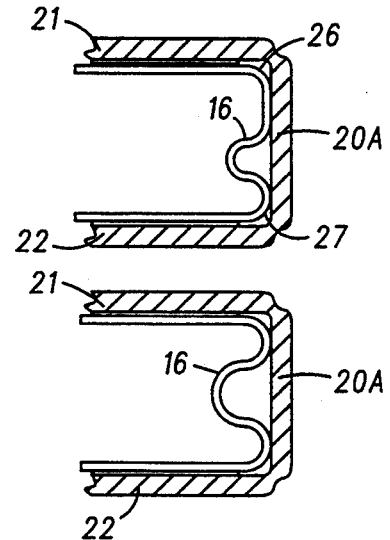
FIG. 6 illustrates two enlarged cross sectional diagrammatic views of the same portion of the bent assembly shown in FIG. 5, but with utilization of the present invention.

Without utilization of the present invention, the above noted bending operations can result in severe creases in the unbonded flexible circuit portion 16 and these creases can either rupture immediately the conductive interconnect paths 17 or form stress sites which will result in the rupturing of these paths and/or the flexible substrate during subsequent temperature cycling. This is best illustrated by reference to FIG. 5 which illustrates three such possible configurations if the present invention were not utilized. In the three views in FIG. 5, many details of the assembly 10 have been eliminated for purposes of clarity, but each of these views illustrates that the intermediate portion 16 has now been bent such that very pronounced creases or undesired bending areas 33 have been provided in the intermediate flexible substrate portion 16. Any of the three configurations shown in FIG. 5 could result after bending, and all of them are potentially detrimental to the reliability of the assembly 10. FIG. 6 illustrates the results when the present invention is utilized to provide desired control of the bend curvature characteristics of the flexible substrate intermediate portion 16. It is apparent that there are no abrupt angular bend portions in FIG. 6 as contrasted with the abrupt angular bend sites 33 shown in FIG. 5, and this is achieved by the specific structure shown in more detail in FIGS. 7 and 8.

Figure 7:
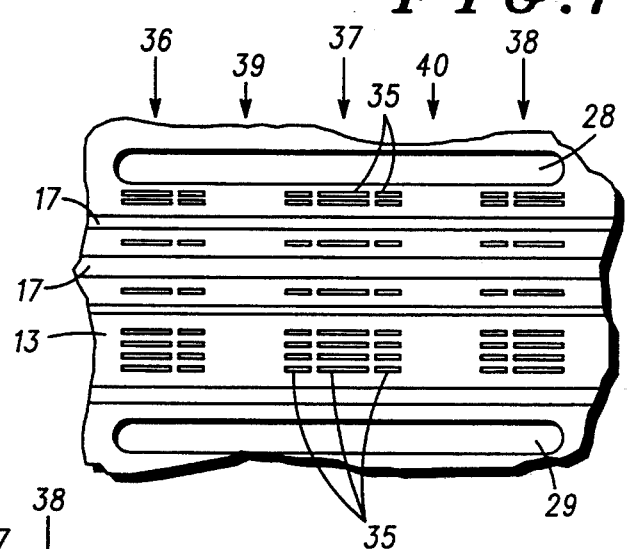
FIG. 7 illustrates an enlarged planar view of an intermediate portion of the flexible assembly shown in FIG. 1 constructed in accordance with one embodiment of the present invention.

Referring now to FIG. 7, a portion of the flexible substrate intermediate portion 16 between the through openings 28 and 29 is illustrated in substantially more detail. FIG. 7 illustrates 4 conductive interconnect paths 17 that are provided in the intermediate portion 16 of the flexible substrate 11. However, FIG. 7 also illustrates that additional stiffening material 35 has been provided on the flexible substrate intermediate portion. This additional stiffening material defines varying areas of stiffness for the flexible substrate intermediate portion 16. These varying areas of stiffness define at least two, and in FIG. 7 three, stiff paths 36, 37 and 38 for the flexible substrate intermediate portion with a pair of less stiff paths 39 and 40 provided between. These stiff paths are represented by arrows in FIG. 7 and clearly extend across the flexible intermediate portion 16 of the substrate 11 and across the conductive metalization interconnect paths 17. These paths are preferably all parallel to one another and preferably parallel to the axes 26 and 27 and the channels 24 and 25. These stiff and less stiff paths define the desired bend curvature characteristics for the flexible substrate intermediate portion 16 and result in achieving the desired results shown in FIG. 6 as opposed to the undesired results shown in FIG. 5. This is implemented by having these stiff and less stiff paths ensure that at certain locations along the flexible substrate intermediate portion 16 there cannot be an abrupt angular bend such as the bends 33 shown in FIG. 5. While the exact configuration of the stiffening material added to the flexible substrate intermediate portion 16 may be altered to achieve any exact type of bend desired, the prior art has not suggested the use of any such additional stiffening material which provides a mix of stiff and less stiff paths that extend across the flexible intermediate substrate portion 16. Thus, this configuration represents a clear departure from and an improvement to the prior art.

Figure 8:
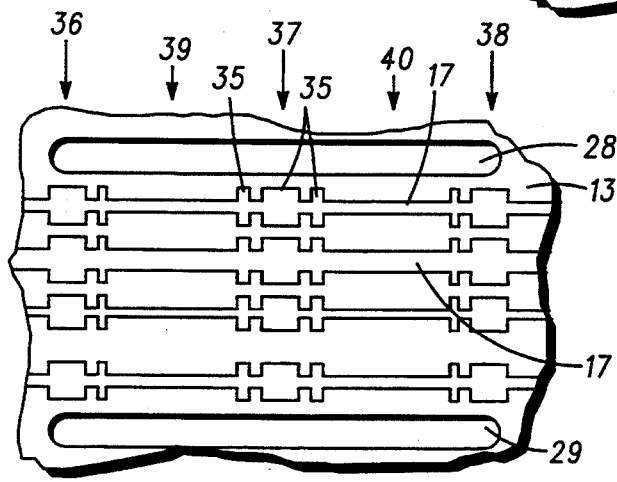
FIG. 8 illustrates an enlarged planar view of an intermediate portion of the assembly shown in FIG. 1 in accordance with another embodiment of the present invention.

It should be noted that preferably the stiffening material areas 35 can just comprise additional conductive metalization patterns which are provided on the substrate and are separate from the conductive interconnect paths 17. FIG. 8 illustrates a different configuration in which the additional stiffening material comprises added metalizations which are extensions of and are connected to the conductive metalization interconnect paths 17. While in FIG. 8, these additional extensions of the interconnect paths 17 are illustrated as essentially abruptly altering the width of the interconnection paths from one fixed width value to another fixed width value, clearly the extensions 35 in FIG. 8 can implement any number of different widths and can be implemented as rounded extensions rather than as abrupt step functions in the width of the conductive interconnect paths 17.

It should be noted that while FIGS. 7 and 8 illustrate the additional stiffening material as comprising areas of additional conductive metalization, the similar result can be achieved by providing the solder mask layer 31 in a patterned configuration over the intermediate portion 16 of the flexible substrate. Again this would not be conventional since the prior art would suggest either providing a uniform solder mask layer over this portion 16 or providing no solder mask layer over this portion 16 since there will be no components mounted in this flexible intermediate portion 16 of the substrate and therefore no need for a pattern of openings in the applied solder mask. Clearly it would not be desirable to mount electrical components on the unbonded flexible intermediate portion 16 since this portion clearly will be subjected to bending stresses potentially jeopardizing the integrity of bonding any electrical components on this section.

Also, it should be noted that while FIGS. 7 and 8 clearly illustrate providing the stiffening material on the top surface 13 of flexible substrate 12, the addition of such stiffening material on the bottom surface of the substrate 11 which directly faces the rigidizer plate 20 would also function just as well. Note that FIG. 2 clearly illustrates that a cavity or space 40 does exist between the unbonded intermediate portion 16 of the flexible substrate and the intermediate portion 20A of the rigidizer plate 20, and the additional stiffening material could be provided on the underside of the flexible substrate portion 16 which faces the rigidizer plate 20.

While we have shown and described specific embodiments of the present invention, further modifications and improvements will occur to those skilled in the art. The above text illustrates several of such modifications which are already contemplated. Another variation can comprise selectively adding solder to the conductive interconnect paths 17 in the intermediate substrate portion to form extensions of the paths so as to vary the substrate bend characteristics (stiffness) by varying the thickness of the paths 17 rather than their width as shown in FIG. 8. Thus the interconnect paths 17 can comprise just base metalization or metalization and solder on top thereof. The selective adding of this solder can occur by use of a patterned solder mask layer on the intermediate substrate portion. All such modifications which retain the basic underlying principles disclosed and claimed herein are within the scope of this invention.

We claim:

1. Flexible circuit board assembly comprising:
   flexible substrate of electrically insulating material having a predetermined thickness and a top surface extending between first and second end portions of said flexible substrate with an intermediate portion of said flexible substrate located therebetween;
   a plurality of conductive metalization interconnect paths fixed to said flexible substrate, each of said interconnect paths extending from at least said substrate first end portion, across said substrate intermediate portion, to said substrate second end portion;
   first and second end portions of a rigidizer plate, said first and second flexible substrate end portions mounted to said first and second end portions of said rigidizer plate, respectively, with said substrate intermediate portion comprising an unmounted portion of said flexible substrate between said first and second end portions of said rigidizer plate; and
   stiffening material selectively provided on said flexible substrate intermediate portion to define varying areas of stiffness for the flexible substrate intermediate portion which varying areas of stiffness define at least 2 stiff paths for the flexible substrate intermediate portion, with a less stiff path for the flexible substrate intermediate portion between the stiff paths, said stiff and less stiff paths extending across the flexible substrate intermediate portion and across the conductive metalization interconnect paths, said stiff and less stiff paths defining desired bend curvature characteristics for the flexible substrate intermediate portion.

2. Flexible circuit board assembly according to claim 1 wherein first and second rigidizer plate end portions are bonded to said first and second substrate end portions, respectively, by a bonding material positioned therebetween, with said substrate intermediate portion comprising an unbonded portion of said flexible substrate between said first and second rigidizer plate portions.

3. Flexible circuit board assembly according to claim 1 wherein said stiffening material comprises added metalization areas provided on said intermediate substrate portion.

4. Flexible circuit board assembly according to claim 3 wherein said added metalization areas are separate from said conductive metalization interconnect paths.

5. Flexible circuit board assembly according to claim 3 wherein said added metalization areas are extensions of and are connected to said conductive metalization interconnect paths.

6. Flexible circuit board assembly according to claim 1 wherein said at least 2 stiff paths define two substantially parallel stiff paths across said intermediate portion of said flexible substrate.

7. Flexible circuit board assembly according to claim 6 wherein said rigidizer plate is preformed to define at least two parallel preferential bend axes extending across said interconnect paths of said intermediate portion of said flexible substrate.

8. Flexible circuit board assembly according to claim 7 wherein said bend axes are substantially parallel to said stiff paths.

9. Flexible circuit board assembly according to claim 7 wherein said rigidizer plate is formed with a pair of channels therein, each channel corresponding to one of said bend axes.

10. Flexible circuit board assembly according to claim 1 wherein said first and second rigidizer plate end portions are portions of a single rigidizer plate which has been bent along at least one bend axis which extends across said interconnect paths of said intermediate portion of said flexible substrate such that said first and second rigidizer plate portions are non coplanar.

11. Flexible circuit board assembly according to claim 1 wherein first and second rigidizer plate end portions are bonded to said first and second substrate end portions, respectively, by bonding material positioned therebetween, with said substrate intermediate portion comprising an unbonded portion of said flexible substrate between said first and second rigidizer plate end portions.

12. Flexible circuit board assembly according to claim 11 wherein said stiffening material comprises added metalization areas provided on said intermediate substrate portion.

13. Flexible circuit board assembly according to claim 12 wherein said added metalization areas are separate from said conductive metalization interconnect paths.

14. Flexible circuit board assembly according to claim 12 wherein said added metalization areas are extensions of and are connected to said conductive metalization interconnect paths.

15. Flexible circuit board assembly according to claim 10 wherein said at least 2 stiff paths define two parallel stiff paths across said intermediate portion of said flexible substrate.

16. Flexible circuit board assembly according to claim 15 wherein said rigidizer plate is preformed to define at least two substantially parallel preferential bend axes extending across said interconnect paths of said intermediate portion of said flexible substrate, said rigidizer plate being bent along said axes such that said first and second rigidizer plate end portions are substantially parallel to each other while being located in different planes.

17. Flexible circuit board assembly according to claim 16 wherein said bend axes are substantially parallel to said stiff paths.

18. Flexible circuit board assembly according to claim 17 wherein said rigidizer plate has a pair of channels former therein, each channel corresponding to one of said bend axes.

19. A method for providing a flexible circuit board assembly comprising the steps of:
providing a flexible substrate of electrically insulating material having a predetermined thickness and a top surface extending between first and second end portions of said flexible substrate with an intermediate portion of said flexible substrate located therebetween;
providing a plurality of conductive metalization interconnect paths, fixed to said flexible substrate, each of said interconnect paths extending from at least said substrate first end portion, across said substrate intermediate portion, to said substrate second end portion;
providing first and second end portions of a rigidizer plate;
mounting said first and second substrate end portions to said first and second end portions of said rigidizer plate, respectively, with said substrate intermediate portion comprising an unmounted portion of said flexible substrate between said first and second end portions of said rigidizer plate; and
selectively providing stiffening material on said substrate intermediate portion to define varying areas of stiffness for the flexible substrate intermediate portion which varying areas of stiffness define at least 2 stiff paths for the flexible substrate intermediate portion, with a less stiff path for the flexible substrate intermediate portion between the stiff paths, said stiff and less stiff paths extending across the flexible substrate intermediate portion and across the conductive metalization interconnect paths, said stiff and less stiff paths defining desired bend curvature characteristics for the flexible substrate intermediate portion.

20. A method according to claim 19 which includes the step of bending said rigidizer plate along at least one bend axis which extends across said interconnect paths of said intermediate portion of said flexible substrate such that said first and second rigidizer plate end portions are non coplanar, said first and second rigidizer plate end portions being coplanar prior to said bending step.

21. A method according to claim 20 wherein said mounting step comprises bonding said first and second rigidizer plate end portions to said first and second substrate end portions, respectively, by bonding material positioned therebetween, with said substrate intermediate portion comprising an unbonded portion of said flexible substrate between said first and second rigidizer plate portions.

22. A method according to claim 21 wherein said step of providing stiffening material comprises the step of adding metalization areas on said intermediate substrate portion.

23. A method according to claim 22 wherein said added metalization areas are separate from said conductive metalization interconnect paths.

24. A method according to claim 22 wherein said added metalization areas are extensions of and are connected to said conductive metalization interconnection paths.

25. A method according to claim 20 wherein said bending step comprises bending said rigidizer plate along two axes extending across said interconnect paths of said intermediate portion of said flexible substrate, said rigidizer plate being bent along said axes such that said first and second rigidizer end portions are substantially parallel to each other while being located in different planes.

26. A method according to claim 25 wherein said bend axes are substantially parallel to said stiff paths.

27. A method according to claim 26 wherein said step of providing said rigidizer plate comprises forming said rigidizer plate with a pair of channels therein, each channel corresponding to one of said bend axes.

* * * * *